United States Patent [19]

Hatch

[11] 4,109,269
[45] Aug. 22, 1978

[54] OPTO-COUPLER SEMICONDUCTOR DEVICE

[75] Inventor: John Alva Hatch, Santa Clara, Calif.

[73] Assignee: National Semiconductor Corporation, Santa Clara, Calif.

[21] Appl. No.: 754,339

[22] Filed: Dec. 27, 1976

[51] Int. Cl.² ............................................ H01L 31/12
[52] U.S. Cl. ........................................ 357/19; 357/68; 357/69
[58] Field of Search ........................ 357/19, 74, 68, 69, 357/70, 75, 76; 250/211 J, 551

[56] References Cited

U.S. PATENT DOCUMENTS

| | | | |
|---|---|---|---|
| 3,436,548 | 4/1969 | Biard et al. | 357/19 |
| 3,780,352 | 12/1973 | Redwanz | 357/74 |
| 3,925,801 | 12/1975 | Haitz et al. | 357/19 |
| 4,001,859 | 1/1977 | Miyoshi et al. | 357/19 |

Primary Examiner—Stanley D. Miller, Jr.
Assistant Examiner—James W. Davie
Attorney, Agent, or Firm—Brown & Martin

[57] ABSTRACT

An opto-coupler semiconductor device includes a sensor integrated circuit mounted on a lead frame with an LED which is attached to beam leads on a copper clad tape mounted directly over the sensor portion of the integrated circuit by means of a transparent adhesive tape disposed directly between the LED and the integrated circuit sensor. The method of assembly is carried out by mounting the sensor integrated circuit upon the lead frame by suitable means such as a eutectic bond, attaching a tape lead or conductor by thermo-compression welding to the LED and thereafter mounting the LED by means of a double adhesive tape directly over the center portion of the integrated circuit. The assembly may then be encased in the usual manner in a body of plastic or the like.

3 Claims, 8 Drawing Figures

MOUNT SENSOR ON LEAD FRAME.

APPLY DOUBLE ADHESIVE TAPE.

MOUNT LED ON APERTURED CONDUCTIVE TAPE.

MOUNT LED OVER SENSOR.

OPTO-COUPLER SEMICONDUCTOR DEVICE

BACKGROUND OF THE INVENTION

The present invention relates to semiconductor devices and pertains particularly to an opto-coupler and method of making same.

Opto-coupler devices comprising a light emitting diode and associated light sensing IC circuit are useful as high-speed miniature switching devices in minature electronic circuits. Such devices, however, because of their size are difficult to assemble.

Conventional assembly and packaging of opto-coupler devices require the use of two lead frames. The light emitting diode is mounted on one of these lead frames and the sensor integrated circuit is mounted on the other lead frame. The lead frame with the LED is then aligned to the sensor portion of the integrated circuit and the two LED frame secured together such as by welding or by encasement in a plastic body. With this construction and approach, however, the vertical separation of the light emitting diode sub-assembly and the alignment thereof is difficult to achieve causing poor final test yields and a high percentage of rejects.

Accordingly, it is desirable that an improved opto-coupler construction and metnod of making same be devised.

SUMMARY AND OBJECTS OF THE INVENTION

It is the primary object of the present invention to overcome the above problem of the prior art.

Another object of the present invention is to provide an improved opto-coupler device.

A further object of the present invention is to provide an improved method of making and assembling opto-coupler devices.

A still further object of the present invention is to provide an improved opto-coupler device and method of making and assembling such device.

In accordance with the primary aspects of the present invention, an opto-coupler device comprises a sensor integrated circuit mounted on a lead frame with a light emitting diode attached to a tape lead mounted over the sensor integrated circuit by means of a double adhesive tape which provides the spacing and attachment of the light emitting diode to the sensor integrated circuit assembly. In accordance with the method of the present invention, a sensor integrated circuit is mounted on a lead frame, a light emitting diode is connected to a lead tape and is then mounted by means of a transparent double adhesive tape in position on the sensor integrated circuit. The leads of the integrated circuit and the LED are then connected to the leads on the lead frame.

BRIEF DESCRIPTION OF THE DRAWING

The above and other objects and advantages of the present invention will become apparent from the following description when read in conjunction with the drawings wherein.

DETAILED DESCRIPTION OF THE PREFERRED EMBODIMENT

Figure 1:
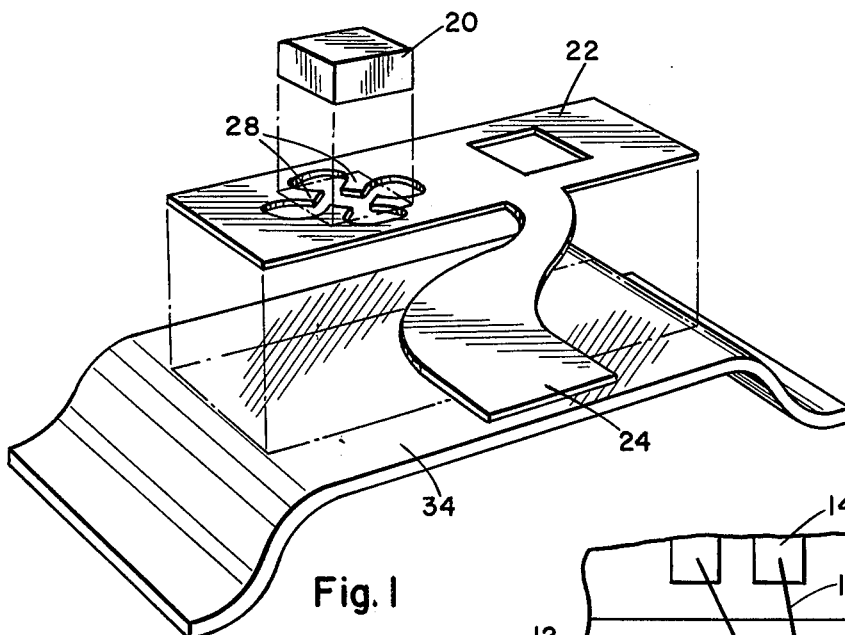
FIG. 1 is an exploded perspective view of the LED mounting components.

Turning particularly to FIGS. 1 through 4 of the drawings, the apparatus of the invention designated generally by the numeral 10 comprises a base or lead frame member 12 having a plurality of lead members 14 mounted thereon. A sensor integrated circuit 16 of the type which is responsive to a light for either activating or completing a circuit is mounted on the lead frame 12 in a suitable manner such as by a means of a gold, silicon utectic bond. Electrical connection of the integrated circuit 16 is established between the circuit thereon and a plurality of pins on the lead frame by means of a plurality of wires 18. The step of mounting the integrated circuit die 16 to the lead frame is carried out by bonding the circuit die 16 to the lead frame by means of a gold silicon eutectic bond.

A light emitting diode 20 is attached to beam heads on a tape 22 which serve as one conductor connected by means of a lead 24 to the lead frame by thermo-compression welding. The tape 22 is a copper clad nickel and gold tape such as that sold under the name Kapton by Du Pont.

Figure 2:
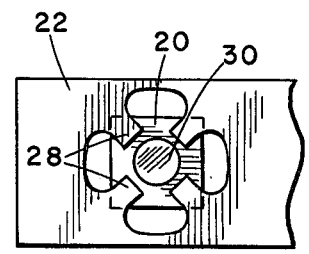
FIG. 2 is an underside view of the LED mounted on its lead tape.
Figure 3:
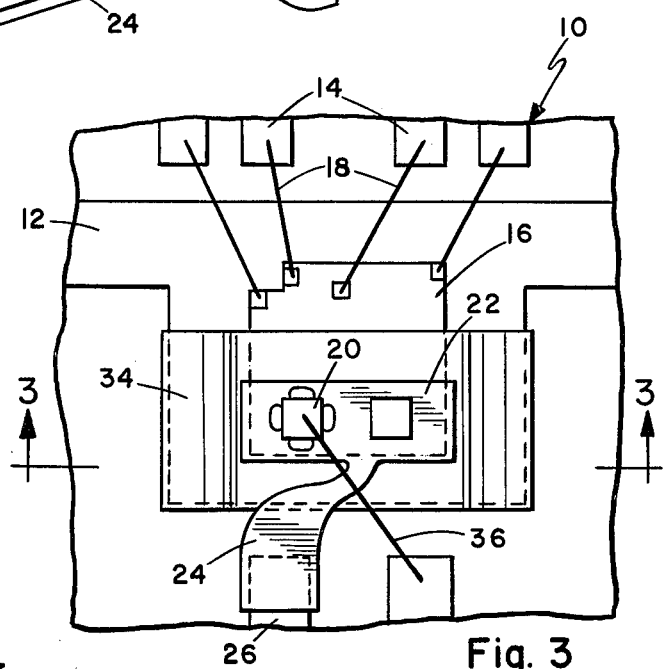
FIG. 3 is a plan view of the LED mounted on the integrated circuit assembly.

The light emitting diode 20 is attached to the conductor tape 22 by means of beam leads 28 formed by four-leaf clover shaped aperture through the tape 22, as in FIG. 2. This forms a symmetric mounting of the LED and a more secure structural connection thereof to a plurality of beam leads defined by the aperature. The light emitting diode 20 includes a light emitting portion 30 which is aligned with the aperture formed in the tape 22.

This light emitting diode sub-assembly is then mounted over the sensor integrated circuit 16 by means of a spacer and bonding tape 34. This bonding tape is a transparent tape of approximately 0.003 inch thick of a suitable material such as that sold under the name Pyralux by Du Pont. The mounting of the LED 20 on the sensor integrated circuit is carried out by means of this tape using heat and pressure. This arrangement gives a uniform spacing of the light emitting diode above the sensor portion of the sensor integrated circuit. This arrangement also permits an easier more accurate alignment of the LED with the underlying sensor.

The electrical connection of the light emitting diode (LED) to the lead frame is carried out by means of a thermo-compression gold ball wire bond 36 between the back side of the LED and the lead frame.

Figure 4:
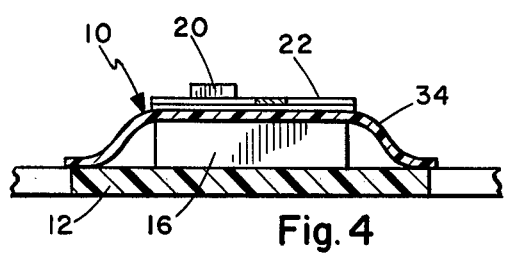
FIG. 4 is a sectional view taken on lines 4—4 of FIG. 3.
Figure 5:
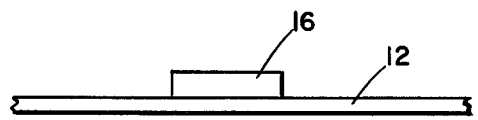
FIGS. 5 through 8 illustrate diagrammatically the steps of the method of the invention.
Figure 6:
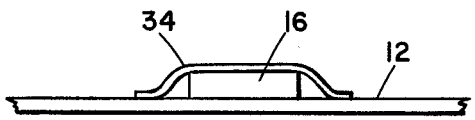
Figure 7:
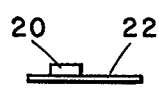
Figure 8:
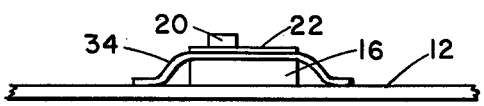

The mounting of the light emitting diode sub-assembly on the sensor circuit die 16 is carried out by placing the tape 34, as shown in FIG. 4, over and across the sensor integrated circuit 16 as shown with the ends of the tape engaging the lead frame 12 and the center thereof engaging the upper surface of the circuit 16. The LED sub-assembly is then positioned over the tape 34 and over the proper position on the sensor integrated circuit die 16 and then placed on the tape 34. The bonding thereof is then carried out by heating the assembly and applying pressure thereto.

The entire assembly as above described may then be encased or molded within a plastic body in the usual manner to provide a dual in line package. This construction eliminates the need for two separate lead frames with the result that the light emitting diode sub-assembly can be accurately placed over the sensor of an integrated circuit. The two sub-assemblies are then held together by means of the adhesive 34 which gives a uniform separation between the two sub-assemblies in every device. This provides an improved and more accurate construction as well as an improved and more accurate method of assembly. This method of assembly and construction has been found to reduce the number of rejects in this particular manufacturing process.

While the present invention has been described and illustrated by means of specific embodiments, it is to be understood that numerous changes and modifications may be made therein without departing from the spirit and scope of the invention, as defined in the appended claims.

Having described my invention, I now claim:

1. An opto-coupler semiconductor device comprising in combination:
    a support member,
    a sensor integrated circuit mounted on said support member,
    a conducting tape having an aperture therethrough,
    a light emitting diode positioned and mounted on said conducting tape for directing light through said aperture in said conducting tape,
    a transparent spacing and mounting tape having an adhesive on both sides thereof extending over said sensor integrated circuit and mounting said light emitting diode on said sensor integrated circuit so that said light emitting diode is aligned with and accurately spaced from said sensor integrated circuit for directing light thereto.

2. The semiconductor device of claim 1, wherein:
    said support member is a lead frame,
    said sensor integrated circuit is bonded to said lead frame by means of a gold silicon eutectic bond, and
    means for connecting said conducting tape to a lead on said lead frame.

3. The semiconductor device of claim 2, wherein:
    said aperture in said conducting tape is of a generally four-leaf clover configuration defining a plurality of beam leads connected to said light emitting diode.

* * * * *